(12) United States Patent
Chang

(10) Patent No.: US 9,214,483 B2
(45) Date of Patent: Dec. 15, 2015

(54) THIN-FILM-TRANSISTOR ARRAY SUBSTRATE AND MANUFACTURING METHOD THEREOF

(71) Applicant: SHENZHEN CHINA STAR OPTOELECTRONICS TECHNOLOGY CO., LTD., Shenzhen (CN)

(72) Inventor: Tsunglung Chang, Shenzhen (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 14/487,129

(22) Filed: Sep. 16, 2014

(65) Prior Publication Data

US 2015/0004759 A1   Jan. 1, 2015

Related U.S. Application Data

(63) Continuation of application No. 13/376,913, filed as application No. PCT/CN2011/079854 on Sep. 20, 2011.

(30) Foreign Application Priority Data

Jul. 7, 2011  (CN) .......................... 2011 1 0189950

(51) Int. Cl.
```
G02F 1/1343    (2006.01)
G02F 1/13      (2006.01)
G02F 1/1362    (2006.01)
H01L 27/12     (2006.01)
```
(Continued)

(52) U.S. Cl.
CPC ............ *H01L 27/1259* (2013.01); *H01L 21/44* (2013.01); *H01L 27/124* (2013.01); *H01L 29/41733* (2013.01); *H01L 29/78606* (2013.01); *G02F 1/1368* (2013.01)

(58) Field of Classification Search
CPC .............. H01L 23/576; H01L 27/3265; H01L 27/1255; H01L 27/12; H01L 27/3244; H01L 29/42384; H01L 27/105; H01L 27/3225
USPC ............... 349/44, 110, 111, 42, 139, 143, 90; 438/22, 30, 31, 32, 182
See application file for complete search history.

(56) References Cited

U.S. PATENT DOCUMENTS 6,927,810 B2   8/2005 Park et al.
7,019,329 B2 * 3/2006 Yamazaki ........... G02F 1/13458
                                                257/57

(Continued)

FOREIGN PATENT DOCUMENTS

CN       1987626    6/2007
CN     101115333    1/2008

(Continued)

*Primary Examiner* — Mary Wilczewski
*Assistant Examiner* — Tsz Chiu
(74) *Attorney, Agent, or Firm* — Mark M. Friedman

(57) ABSTRACT

The present invention discloses a thin-film-transistor array substrate and a manufacturing method thereof. The array substrate includes a thin-film transistor and a compensation electrode. A gate electrode of the thin-film transistor is a portion of a scan-signal line and has an opening, and the opening extends to a side of the scan-signal line. A drain electrode of the thin-film transistor is disposed correspondingly to the opening. A source electrode of the thin-film transistor extends from a side of a data-signal line and surrounds the drain electrode. The compensation electrode extends from another side of the scan-signal line and corresponds to the gate electrode. Therefore, the present invention is capable of reducing parasitic capacitance between the drain electrode and the gate electrode without increasing the resistance value of the scan-signal line.

6 Claims, 4 Drawing Sheets

(51) Int. Cl.
*H01L 29/417* (2006.01)
*H01L 29/786* (2006.01)
*H01L 21/44* (2006.01)
*G02F 1/1368* (2006.01)

(56) References Cited

U.S. PATENT DOCUMENTS

| | | | | |
|---|---|---|---|---|
| 7,538,399 B2 * | 5/2009 | Kim | ............ | H01L 21/84 257/401 |
| 7,968,873 B2 * | 6/2011 | Lee | ............ | H01L 27/322 257/40 |
| 8,604,479 B2 * | 12/2013 | Lee | ............ | G02F 1/134363 257/291 |
| 8,803,147 B2 * | 8/2014 | Shin | ............ | H01L 27/1214 257/59 |
| 2004/0080681 A1 | 4/2004 | Moon | | |
| 2010/0012979 A1 | 1/2010 | Ishii | | |
| 2011/0073860 A1 | 3/2011 | Kanno et al. | | |

FOREIGN PATENT DOCUMENTS

| | | |
|---|---|---|
| CN | 101359670 | 2/2009 |
| CN | 101504500 | 8/2009 |
| JP | 2003347558 | 12/2003 |

* cited by examiner

THIN-FILM-TRANSISTOR ARRAY SUBSTRATE AND MANUFACTURING METHOD THEREOF

CROSS REFERENCE TO RELATED APPLICATIONS

This application is a continuation application of U.S. patent application Ser. No. 13/376,913, filed on Dec. 8, 2011, the disclosure of which is herein incorporated by reference in its entirety.

FIELD OF THE INVENTION

The present invention relates to a thin-film-transistor array substrate, especially to a thin-film-transistor array substrate and a manufacturing method thereof.

BACKGROUND OF THE INVENTION

In conventional technologies, the structure of a TFT-LCD (Thin Film Transistor Liquid Crystal Display) mainly comprises two glass substrates and a liquid crystal layer disposed therebetween, wherein a surface of the upper glass substrate has a color filter mounted thereon, the color filter includes color filter units and black matrix; and a surface of the lower glass substrate has thin-film transistors and pixel electrodes mounted thereon, therefore it is generally called TFT Array Substrate.

In a thin-film-transistor array substrate, the structure of a sub-pixel comprises a pixel electrode, a thin-film transistor and a storage capacitor, wherein a gate electrode of the thin-film transistor is connected a scan-signal line, a source electrode thereof is connected to a data-signal line, a drain electrode thereof is connected to the pixel electrode; and the storage capacitor is connected to the pixel electrode. By means of the scan-signal line, the gate electrode of the thin-film transistor is forced with a voltage, which is capable of conducting the thin-film transistor. The source electrode of the thin-film transistor then, by means of the data-signal line, receives a data signal and transmits the data signal to the drain electrode, and further writes it in the pixel electrodes and stores it in the storage capacitor.

Besides the storage capacitor, many parasitic capacitances further exist in the actual structure of the thin-film transistor further, those parasitic capacitances are unnecessary to the thin-film transistor and may cause electronic losing and affect the operation characteristic of the thin-film transistor.

With reference to FIG. 1, FIG. 1 is a scheme diagram of a partial structure of a conventional thin-film-transistor array substrate. As shown in FIG. 1, a thin-film transistor 9 is disposed close to a point of the junction of a scan-signal line 8 and a data-signal line 7, wherein, the thin-film transistor 9 includes a gate electrode 90, a semiconductor layer 91, a drain electrode 92 and a source electrode 93, wherein, the gate electrode 90 is a portion of the scan-signal line 8; the semiconductor layer 91 is mounted upon the gate electrode 90 with an isolation layer placed therebetween (not shown in the figure); the drain electrode 92 is disposed on the semiconductor layer 91; the source electrode 93 extends from a side of the data-signal line 7 along the edge of the semiconductor layer 91 and then surrounds the drain electrode 92. Parasitic capacitances exist between the drain electrode 92 and the gate electrode 90.

With further reference to FIG. 2, in order to decrease the parasitic capacitances that exist between the drain electrode 92 and the gate electrode 90, the gate electrode 90 further has an opening 900 corresponding to the drain electrode 92, so as to reduce an overlapping area of the gate electrode 90 to the drain electrode 92, and thereby decreases the parasitic capacitances formed therebetween.

However, the opening 900 of the gate electrode 90 will reduce the area of the scan-signal line 8, and thereby increase the numeral value of the resistance of the scan-signal line 8. The transmission speed of the scan-signal line 8 will be affected due to the increased resistance.

Therefore, it is necessary to provide a thin-film-transistor array substrate and a manufacturing method thereof to overcome the problems existing in the conventional technology.

SUMMARY OF THE INVENTION

An object of the invention is to provide a thin-film-transistor array substrate and a manufacturing method thereof to solve the problems about causing resistance value of signal lines to be increased in an attempt to reduce parasitic capacitance between a drain electrode and a gate electrode.

In view of the shortcomings of the conventional technology, a primary object of the present invention is to provide a thin-film-transistor array substrate, which is capable of reducing the parasitic capacitance between a drain electrode and a gate electrode without increasing resistance value of a scan-signal line.

In order to achieve foregoing object of the present invention, the present invention provides a thin-film-transistor array substrate comprising:

a substrate;

a scan-signal line mounted on the substrate along a horizontal direction and having a first side and a second side opposite to the first side;

a data-signal line mounted on the substrate along a vertical direction and isolatedly crossed with the scan-signal line;

a thin-film transistor formed closed to a junction of the scan-signal line and the data-signal line and having a gate electrode, a semiconductor layer, a drain electrode and a source electrode, wherein the gate electrode is a portion of the scan-signal line and has an opening, the opening is disposed in a center of the gate electrode and extends to the first side of the scan-signal line; the semiconductor layer is isolatedly mounted on the gate electrode; the drain electrode is mounted on the semiconductor layer and corresponds to the opening of the gate electrode in position; the source electrode extends from a side of the data-signal line and surrounds the drain electrode and the opening of the gate electrode along an edge of the semiconductor layer; and a compensation electrode integrally extending from the second side of the scan-signal line and corresponding to the gate electrode; wherein, an area of the compensation electrode is equal to an area of the opening of the gate electrode, and a distance between the compensation electrode and the data-signal line is more than 3.5 micrometers.

In order to accomplish the foregoing object of the present invention, the present invention further provides a thin-film-transistor array substrate comprising:

a substrate;

a scan-signal line mounted on the substrate along a horizontal direction and having a first side and a second side opposite to the first side;

a data-signal line mounted on the substrate along a vertical direction and isolatedly crossed with the scan-signal line;

a thin-film transistor formed closed to a junction of the scan-signal line and the data-signal line and having a gate electrode, a semiconductor layer, a drain electrode and a source electrode, wherein the gate electrode is a portion of the scan-signal line and has an opening, the opening is disposed in a center of the gate electrode and extends to the first side of the scan-signal line; the semiconductor layer is isolatedly mounted on the gate electrode; the drain electrode is mounted on the semiconductor layer and corresponds to the opening of the gate electrode in position; the source electrode extends from a side of the data-signal line and surrounds the drain electrode and the opening of the gate electrode along an edge of the semiconductor layer; and a compensation electrode integrally extending from the second side of the scan-signal line and corresponding to the gate electrode.

In one embodiment of the present invention, the opening of the gate electrode is rectangular.

In one embodiment of the present invention, the drain electrode is reversed T-shaped and has a horizontal portion and a vertical portion, the horizontal portion is parallel with the first side and the second side of the scan-signal line and corresponds to the opening of the gate electrode; the vertical portion extends from a side of the horizontal portion and is perpendicular to the first side of the scan-signal line and corresponds to the opening of the gate electrode.

In one embodiment of the present invention, a width of the vertical portion is less than a width of the opening of the gate electrode.

In one embodiment of the present invention, an area of the compensation electrode is equal to an area of the opening.

In one embodiment of the present invention, the compensation electrode is trapezoid shaped.

In one embodiment of the present invention, a distance between the compensation electrode and the data-signal line is more than 3.5 micrometers.

The present invention further provides a manufacturing method of the thin-film-transistor array substrate, and the manufacturing method comprises steps of:

forming a scan-signal line and a compensation electrode on a substrate, wherein the scan-signal line has a first side, a second side opposite to the first side and an opening, and the opening extends to the first side; the compensation electrode extends from the second side of the scan-signal line;

forming a first isolation layer on the scan-signal line;

forming a semiconductor layer on the first isolation layer, wherein the semiconductor layer is disposed in a position corresponding to the opening; and forming a data-signal line, a drain electrode and a source electrode, wherein the data-signal line and the scan-signal line are isolatedly crossed with each other, the drain electrode is disposed on the semiconductor layer and corresponds to the opening of the scan-signal line, the source electrode extends from a side of the data-signal line, is disposed on the semiconductor layer and surrounds the drain electrode and the opening of the gate electrode along an edge of the semiconductor layer.

In one embodiment of the present invention, the manufacturing method further comprises steps of:

forming a second isolation layer on the semiconductor layer, the drain electrode and the source electrode, wherein the second isolation layer has a through hole; the through hole correspondingly exposes a part of the drain electrode; and forming a pixel electrode in a pixel area defined by the scan-signal line and the data-signal line, wherein the pixel electrode is connected to the drain electrode through the through hole of the second isolation layer.

In one embodiment of the present invention, the compensation electrode is trapezoid shaped, and is at a distance of more than 3.5 micrometers from the data-signal line.

The present invention, in accordance with the opening of the scan-signal line, mainly makes an opposite side of the scan-signal line to extend a compensation electrode, so as to prevent the opening from increasing the resistance value of the scan-signal line and still be capable of reducing parasitic capacitance formed between the drain electrode and the gate electrode.

DETAILED DESCRIPTION OF THE PREFERRED EMBODIMENTS

The foregoing objects, features and advantages adopted by the present invention can be best understood by referring to the following detailed description of the preferred embodiments and the accompanying drawings. Furthermore, the directional terms described in the present invention, such as upper, lower, front, rear, left, right, inner, outer, side and etc., are only directions referring to the accompanying drawings, so that the used directional terms are used to describe and understand the present invention, but the present invention is not limited thereto.

Figure 1:
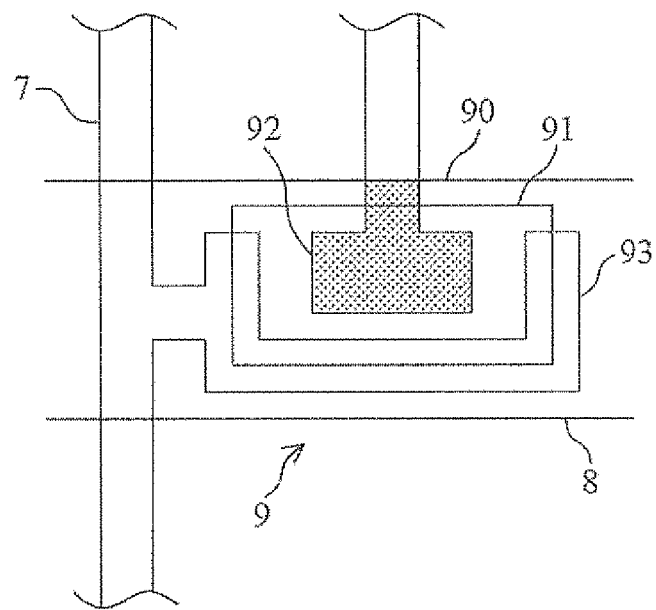
FIG. 1 is a schematic diagram of a partial structure of a conventional thin-film-transistor array substrate.
Figure 2:
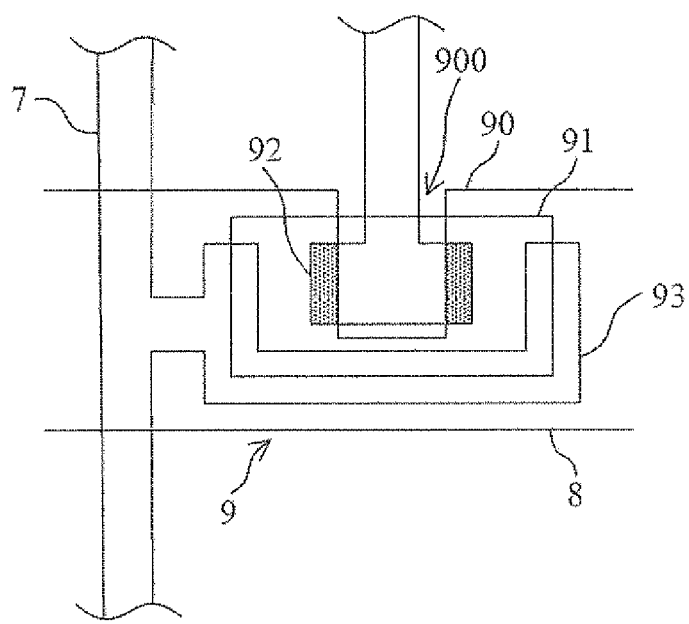
FIG. 2 is a schematic diagram of a partial structure of another conventional thin-film-transistor array substrate.
Figure 3:
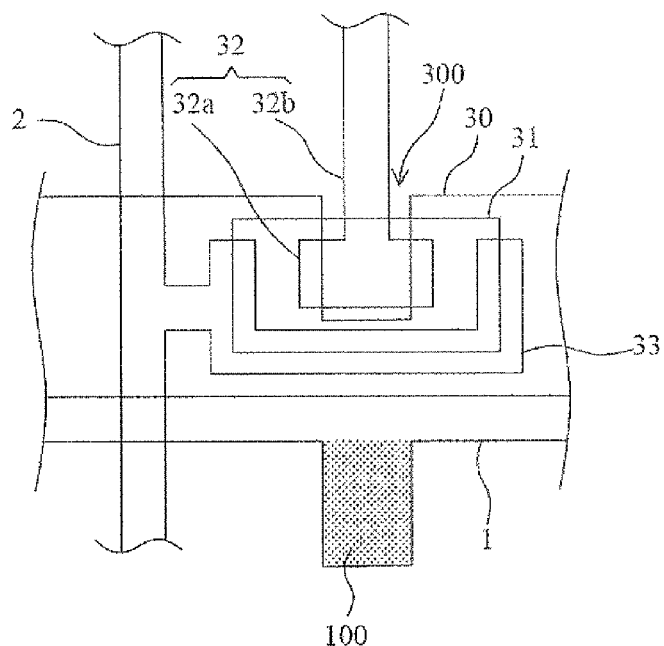
FIG. 3 is a schematic diagram of a partial structure of a first embodiment of a thin-film-transistor array substrate in accordance with the present invention.

A thin-film-transistor substrate in accordance with the present invention is mainly constructed by mounting a thin-film-transistor array on a substrate. With reference to FIG. 3, FIG. 3 is a schematic diagram of a partial structure of a first embodiment of a thin-film-transistor array substrate in accordance with the present invention. As shown in FIG. 3, besides the aforementioned substrate (not shown in the figure), the thin-film-transistor array substrate further comprises a scan-signal line 1, a data-signal line 2, a thin-film transistor 3 and a compensation electrode 100. The aforementioned amount of each component is merely used to describe and understand the present invention, but not to limit the amount of each component of the present invention.

The scan-signal line 1 is mounted on the substrate along a horizontal direction and has a first side and a second side opposite to the first side.

The data-signal line 2 is mounted on the substrate along a vertical direction and isolatedly crossed with the scan-signal line 1.

The thin-film transistor 3 is formed close to a junction of the scan-signal line 1 and the data-signal line 2 and comprises a gate electrode 30, a semiconductor layer 31, a drain electrode 32 and a source electrode 33.

The gate electrode 30 is a portion of the scan-signal line 1 and has an opening 300, and the opening 300 is disposed in a center of the gate electrode 30 and extends to the first side of the scan-signal line 1. In the embodiment, the opening 300 is preferably rectangular.

The semiconductor layer 31 is isolatedly (preferably using an isolation layer) mounted on the gate electrode 30.

The drain electrode 32 is mounted on the semiconductor layer 31 and disposed in a position corresponding to the opening 300 of the gate electrode 30. In this embodiment, the drain electrode 32 is preferably reversed T-shaped, and has a horizontal portion 32a and a vertical portion 32b. An extension direction of the horizontal portion 32a is parallel to the first side and the second side of the scan-signal line 1, and the horizontal portion 32a corresponds to the opening 300 of the gate electrode 30. The horizontal portion 32a is partially overlapped with the gate electrode 30, and preferably an edge of the horizontal portion 32a is overlapped with the gate electrode 30. The vertical portion 32b extends from a side of the horizontal portion 32a, is perpendicular to the first side of the scan-signal line 1 and corresponds to the opening 300 of the gate electrode 30. A width of the vertical portion 32b is preferably less than a width of the opening 300 of the gate electrode 30.

The source electrode 33 extends from a side of the data-signal line 2 and surrounds the drain electrode 32 and the opening 300 of the gate electrode 30 along an edge of the semiconductor layer 31.

The compensation electrode 100 integrally extends from the second side of the scan-signal line 1 and corresponds to the gate electrode 30. In this embodiment, an area of the compensation electrode 100 is preferably equal to an area of the opening 300, and corresponds to the opening 300 to be rectangular.

Figure 4:
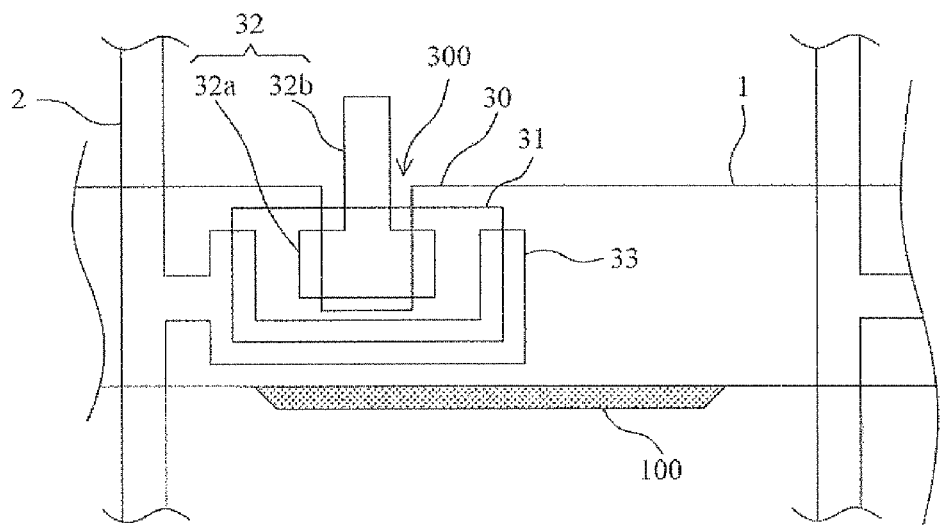
FIG. 4 is a schematic diagram of a partial structure of a second embodiment of a thin-film-transistor array substrate in accordance with the present invention.

With reference to FIG. 4, FIG. 4 is a schematic diagram of a partial structure of a second embodiment of a thin-film-transistor array substrate in accordance with the present invention. The second embodiment of the present invention is similar to the first embodiment of the present invention, and uses similar terms and numerals of the first embodiment, but differs from the first embodiment in that: the compensation electrode 100 is trapezoid shaped. And a distance between the compensation electrode 100 and the data-signal line 2 is preferably more than 3.5 micrometers.

Since the second side of the scan-signal line 1 has the compensation electrode 100 to extend therefrom, the present invention is capable of avoiding increasing the resistance value of the scan-signal line 1 due to the forming of the opening 300.

Figure 5A:
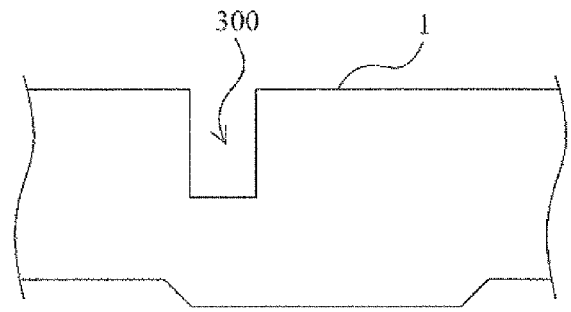
FIGS. 5A to 5E are schematic diagrams of a manufacturing process of a preferred embodiment of the thin-film-transistor array substrate in accordance with the present invention.
Figure 5B:
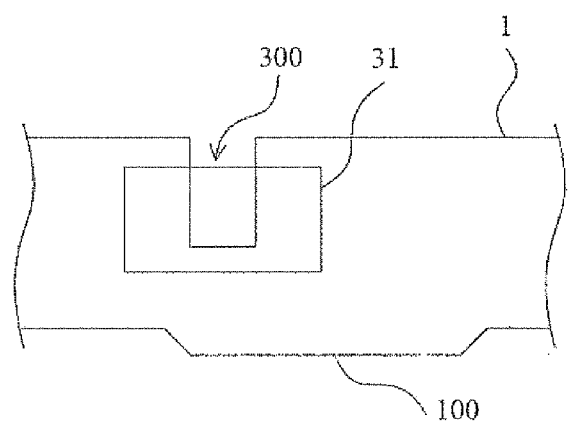
Figure 5C:
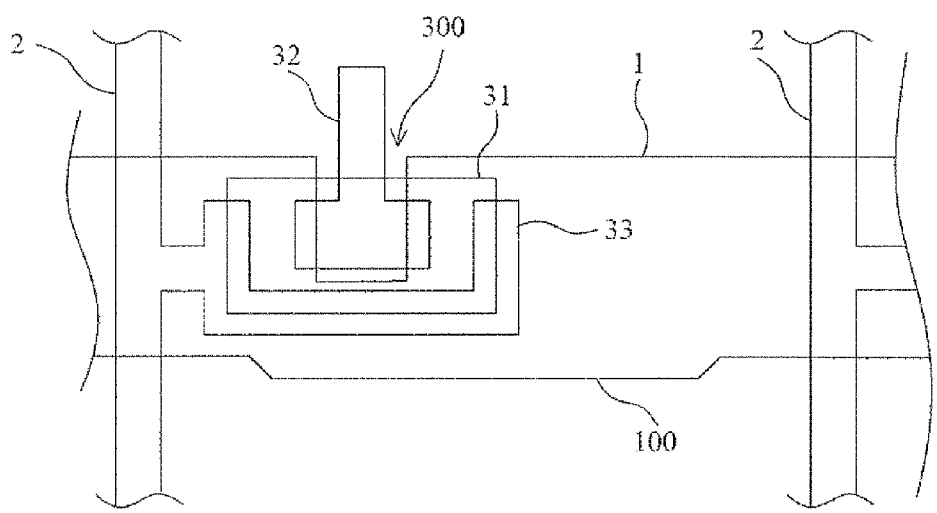
Figure 5:
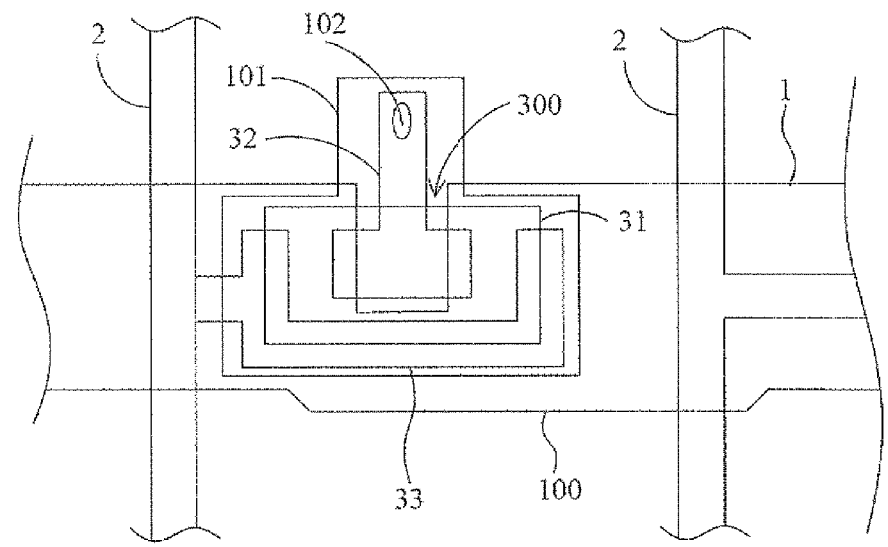
Figure 5:
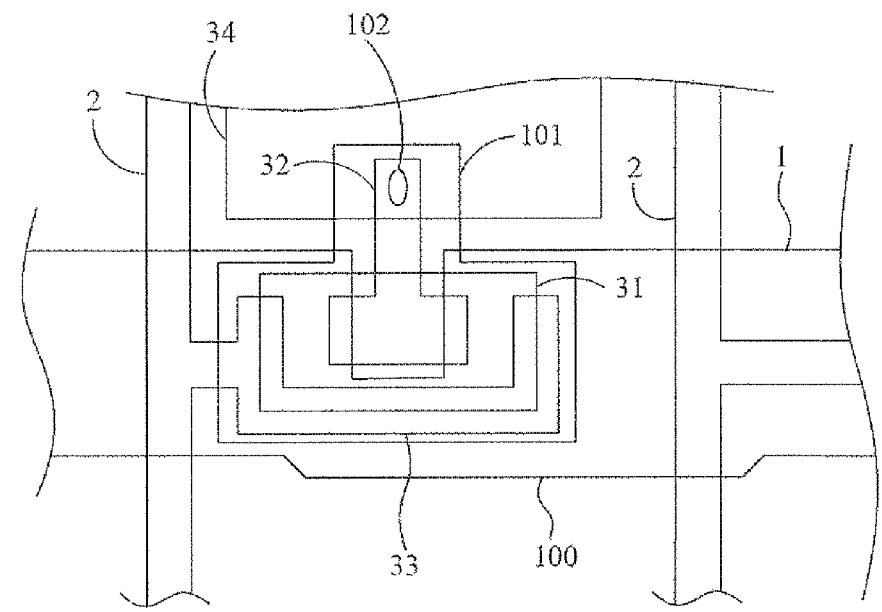

With reference to FIGS. 5A to 5E, FIGS. 5A to 5E are schematic diagrams of a manufacturing process of a preferred embodiment of the thin-film-transistor array substrate in accordance with the present invention. Cooperating with FIGS. 5A to 5E, the manufacturing method of the thin-film-transistor array substrate of the present invention comprises steps of:

S1: forming a scan-signal line 1 and a compensation electrode 100 on a substrate, wherein the scan-signal line 1 has a first side, a second side opposite to the first side and an opening 300, and the opening 300 extends to the first side; the compensation electrode 100 extends from the second side of the scan-signal line 1 (as shown in FIG. 5A);

S2: forming a first isolation layer (not shown in Figs.) on the scan-signal line 1;

S3: forming a semiconductor layer 31 on the first isolation layer, wherein the semiconductor layer 31 is disposed in a position corresponding to the opening 300 (as shown in FIG. 5B);

S4: forming a data-signal line 2, a drain electrode 32 and a source electrode 33, wherein the data-signal line 2 and the scan-signal line 1 are isolatedly crossed with each other, the drain electrode 32 is reversed T-shaped and disposed on the semiconductor layer 31 and corresponds to the opening 300 of the scan-signal line 1, the source electrode 33 extends from a side of the data-signal line 2, is disposed on the semiconductor layer 31 and surrounds the drain electrode 32 and the opening 300 of the gate electrode 30 along an edge of the semiconductor layer 31 (as shown in FIG. 5C);

S5: forming a second isolation layer 101 on the semiconductor layer 31, the drain electrode 32 and the source electrode 33, wherein the second isolation layer 101 has a through hole 102; the through hole 102 correspondingly exposes a part of the drain electrode 32 (as shown in FIG. 5D); and S6: forming a pixel electrode 34 in a pixel area defined by the scan-signal line 1 and the data-signal line 2, wherein the pixel electrode 34 is connected to the drain electrode 32 through the through hole 102 of the second isolation layer 101 (as shown in FIG. 5E).

With the manufacturing process of the aforementioned steps S1~S6, the thin-film-transistor array substrate shown in FIG. 4 can be constructed.

In conclusion, the present invention, in view of the opening of the scan-signal line, forms a compensation electrode extending from the second side of the scan-signal line, so as to compensate the reduced part of areas of the scan-signal line, and thereby to further prevent the resistance value of the scan-signal line from increasing due to the forming of the opening, and meanwhile, to maintain the effect of reducing the parasitic capacitance between the drain electrode and the gate electrode.

The present invention has been described with a preferred embodiment thereof and it is understood that many changes and modifications to the described embodiment can be carried out without departing from the scope and the spirit of the invention that is intended to be limited only by the appended claims.

What is claimed is:

1. A manufacturing method of a thin-film-transistor array substrate, comprising steps of:

forming a scan-signal line and a compensation electrode on a substrate, wherein the scan-signal line has a first side, a second side opposite to the first side and an opening, and the opening extends to the first side; the compensation electrode extends from the second side of the scan-signal line, and an area of the compensation electrode is equal to an area of the opening;

forming a first isolation layer on the scan-signal line;

forming a semiconductor layer on the first isolation layer, wherein the semiconductor layer is disposed in a position corresponding to the opening; and forming a data-signal line, a drain electrode and a source electrode so that a thin-film transistor is formed with a gate electrode, the semiconductor layer, the drain electrode and the source electrode, and a distance between the compensation electrode and the data-signal line is more than 3.5 micrometers, wherein the gate electrode is a portion of the scan-signal line having the opening; the data-signal line and the scan-signal line are isolatedly crossed with each other; the drain electrode is disposed on the semiconductor layer and corresponds to the opening of the scan-signal line; the source electrode extends from a side of the data-signal line, is disposed on the semiconductor layer and surrounds the drain electrode and the opening of the gate electrode along an edge of the semiconductor layer.

2. The manufacturing method of the thin-film-transistor array substrate as claimed in claim 1, wherein the manufacturing method further comprises steps of:

forming a second isolation layer on the semiconductor layer, the drain electrode and the source electrode, wherein the second isolation layer has a through hole; the through hole correspondingly exposes a part of the drain electrode; and forming a pixel electrode in a pixel area defined by the scan-signal line and the data-signal line, wherein the pixel electrode is connected to the drain electrode through the through hole of the second isolation layer.

3. The manufacturing method of the thin-film-transistor array substrate as claimed in claim 1, the opening is rectangular.

4. The manufacturing method of the thin-film-transistor array substrate as claimed in claim 3, wherein the drain electrode is reversed T-shaped and has a horizontal portion and a vertical portion, the horizontal portion is parallel with the first side and the second side of the scan-signal line and corresponds to the opening; the vertical portion extends from a side of the horizontal portion and is perpendicular to the first side of the scan-signal line and corresponds to the opening.

5. The manufacturing method of the thin-film-transistor array substrate as claimed in claim 4, a width of the vertical portion is less than a width of the opening.

6. The manufacturing method of the thin-film-transistor array substrate as claimed in claim 4, the compensation electrode is trapezoid shaped.

* * * * *